United States Patent
Ng et al.

(10) Patent No.: US 8,680,624 B2
(45) Date of Patent: Mar. 25, 2014

(54) METHODS FOR FORMING BARRIER REGIONS WITHIN REGIONS OF INSULATING MATERIAL RESULTING IN OUTGASSING PATHS FROM THE INSULATING MATERIAL AND RELATED DEVICES

(75) Inventors: Man Fai Ng, Poughkeepsie, NY (US); Bin Yang, Mahwah, NJ (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/488,109

(22) Filed: Jun. 4, 2012

(65) Prior Publication Data
US 2012/0235237 A1 Sep. 20, 2012

Related U.S. Application Data

(62) Division of application No. 12/707,150, filed on Feb. 17, 2010, now Pat. No. 8,222,093.

(51) Int. Cl.
*H01L 21/70* (2006.01)
*H01L 27/088* (2006.01)
*H01L 29/06* (2006.01)

(52) U.S. Cl.
USPC .... 257/397; 257/510; 257/619; 257/E29.051; 257/E29.27

(58) Field of Classification Search
USPC ............. 257/397, 510, 619, E29.051, E29.27
See application file for complete search history.

(56) References Cited

U.S. PATENT DOCUMENTS

| 5,468,657 A | 11/1995 | Hsu |
| 6,261,920 B1 * | 7/2001 | Oyamatsu ..................... 438/424 |
| 6,303,413 B1 * | 10/2001 | Kalnitsky et al. ............. 438/151 |
| 6,323,106 B1 * | 11/2001 | Huang et al. .................. 438/433 |
| 6,518,635 B1 | 2/2003 | Shiozawa et al. |
| 6,673,695 B1 | 1/2004 | Lim et al. |
| 6,696,743 B1 * | 2/2004 | Hasegawa ..................... 257/513 |
| 6,724,053 B1 | 4/2004 | Divakaruni et al. |
| 7,259,054 B2 | 8/2007 | Yasuoka et al. |
| 7,960,286 B2 | 6/2011 | Liao et al. |
| 2005/0124105 A1 | 6/2005 | Kanemoto |

OTHER PUBLICATIONS

USPTO Non-Final Office Action mailed Sep. 30, 2011; U.S. Appl. No. 12/707,150, filed Feb. 17, 2010.
Response to Non-Final Office Action for U.S. Appl. No. 12/707,150, dated Dec. 29, 2011.

* cited by examiner

*Primary Examiner* — Charles Garber
*Assistant Examiner* — Ron Pompey
(74) *Attorney, Agent, or Firm* — Ingrassia Fisher & Lorenz, P.C.

(57) ABSTRACT

Methods and devices are provided for fabricating a semiconductor device having barrier regions within regions of insulating material resulting in outgassing paths from the regions of insulating material. A method comprises forming a barrier region within an insulating material proximate the isolated region of semiconductor material and forming a gate structure overlying the isolated region of semiconductor material. The barrier region is adjacent to the isolated region of semiconductor material, resulting in an outgassing path within the insulating material.

11 Claims, 5 Drawing Sheets

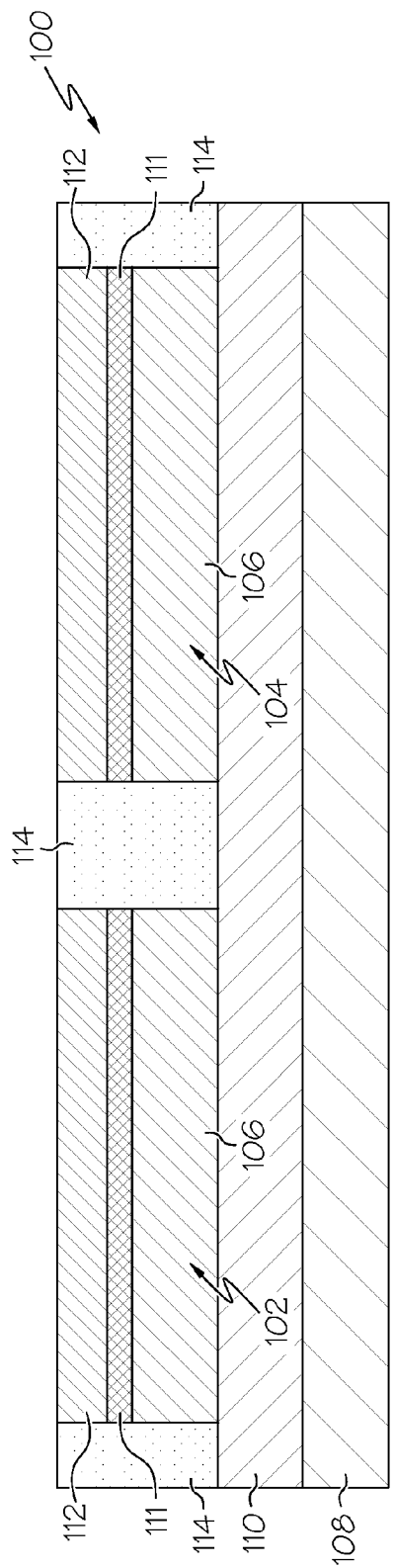
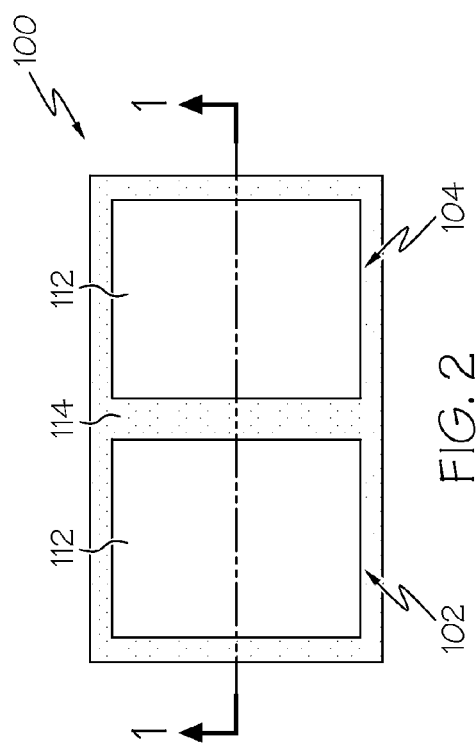
FIG. 1
FIG. 2

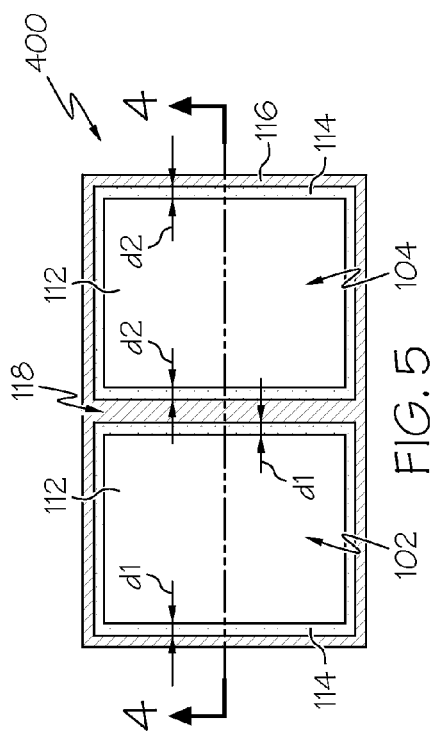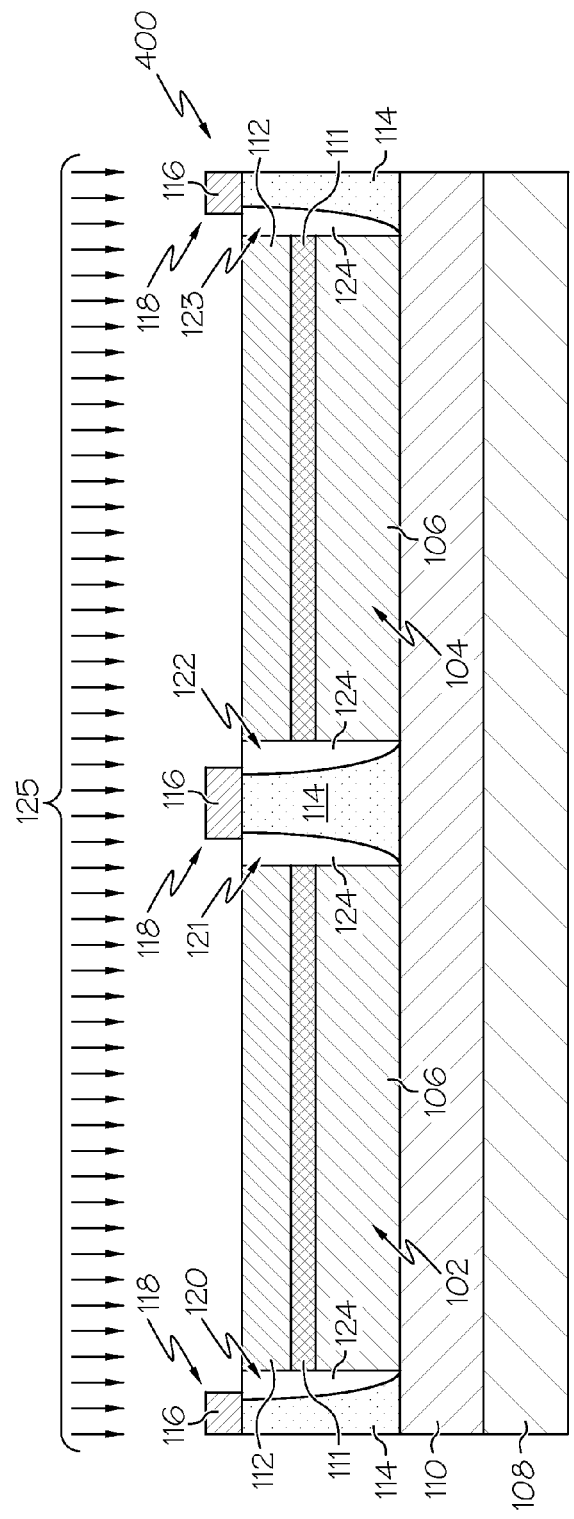

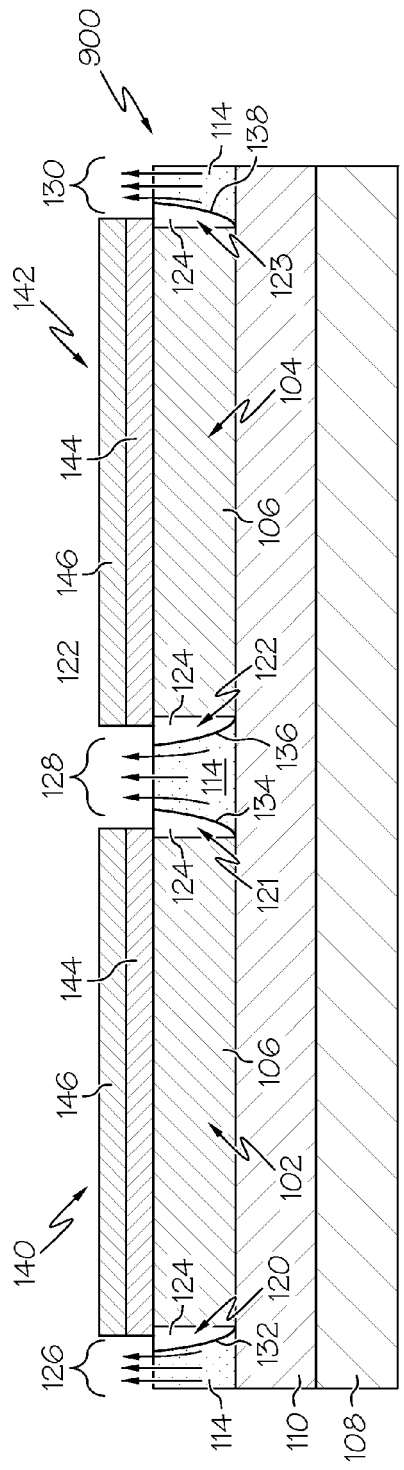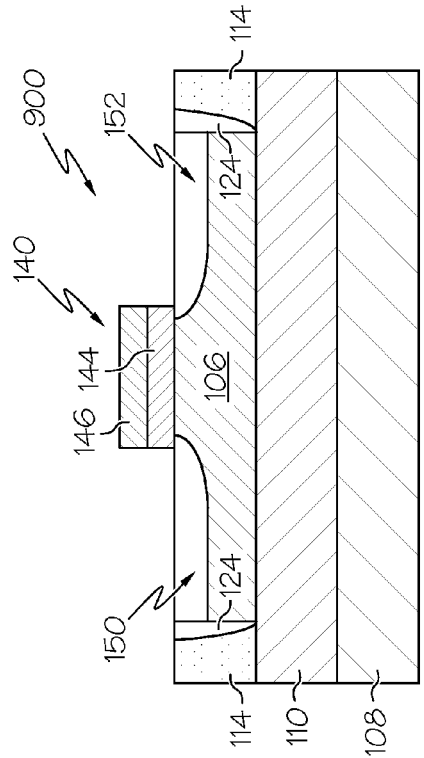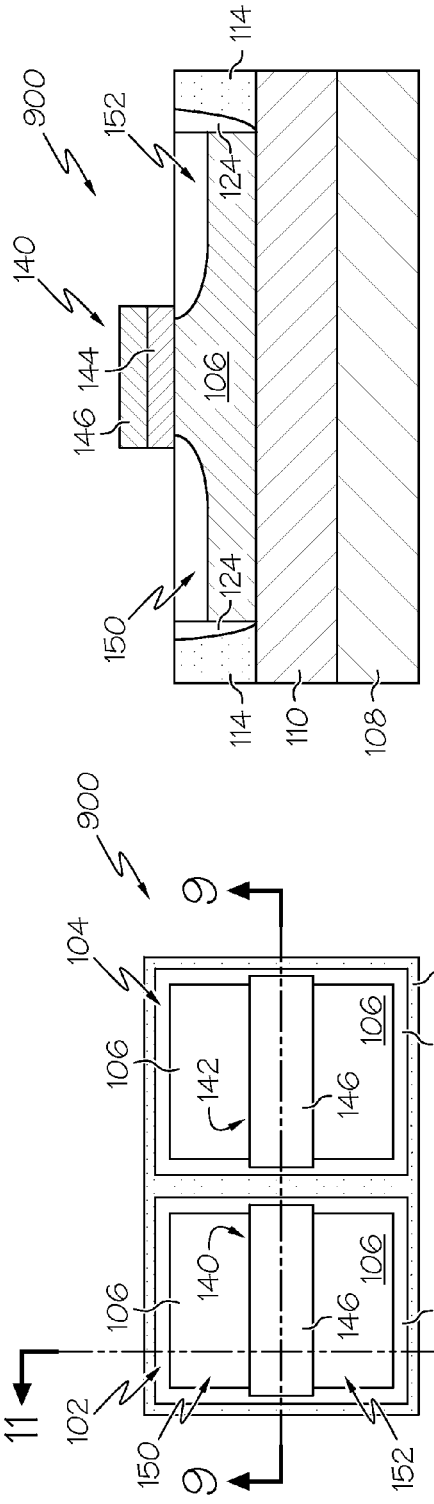

METHODS FOR FORMING BARRIER REGIONS WITHIN REGIONS OF INSULATING MATERIAL RESULTING IN OUTGASSING PATHS FROM THE INSULATING MATERIAL AND RELATED DEVICES

CROSS-REFERENCE TO RELATED APPLICATIONS

This application is a divisional of U.S. application Ser. No. 12/707,150, filed Feb. 17, 2010, which is incorporated herein by reference in its entirety.

TECHNICAL FIELD

Embodiments of the subject matter generally relate to semiconductor device structures and related fabrication methods, and more particularly, embodiments of the subject matter relate to methods for forming barrier regions within regions of insulating material resulting in outgassing paths from the regions of insulating material and devices having the same.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

As device geometries shrink, the gate leakage current contributes proportionally more to the overall device leakage current. One technique to reduce the gate leakage current is to replace the gate insulator material with a dielectric material having a higher dielectric constant (e.g., a high-k dielectric), such as a hafnium-based oxide. However, the threshold voltage (Vt) of a high-k device is more sensitive to the device width (W). Because device width will vary from one device to another depending on the design needs, when high-k dielectric materials are used in conventional processes, the variation in the gate widths produces unacceptably wide variations in threshold voltages among devices.

In practice, the width of the gate stack is often greater than the width of the underlying semiconductor material and overlaps onto the field oxide. This accounts for potential misalignment as well as rounding of an end of the gate line and ensures that the length of the channel formed during subsequent ion implantation steps is consistent along the device width and that the drain and source regions of the device are not contiguous. However, it is believed that the threshold voltage sensitivity in high-k devices is attributable to oxygen diffusing from the field oxide to the gate stack, also known as the antenna effect. One proposed approach to this issue involves nitridation of the surface of the field oxide. While this reduces the threshold voltage sensitivity, the threshold voltage remains sensitive to device width because oxygen from the field oxide underlying the nitride will still diffuse to the gate stack.

BRIEF SUMMARY

A method is provided for fabricating a semiconductor device structure on an isolated region of semiconductor material. The method comprises forming a barrier region within an insulating material proximate the isolated region of semiconductor material and forming a gate structure overlying the isolated region of semiconductor material. The barrier region is adjacent to the isolated region of semiconductor material, resulting in an outgassing path within the insulating material.

Another method is provided for fabricating a semiconductor device. The method comprises providing a semiconductor substrate formed from a semiconductor material, forming an oxide material in the semiconductor substrate, resulting in an isolated region of semiconductor material, and forming one or more barrier regions adjacent to the isolated region. The one or more barrier regions are interposed between at least a portion of the oxide material and the isolated region such that the one or more barrier regions define one or more outgassing paths in the oxide material. The method further comprises forming a gate structure overlying the isolated region, wherein the one or more barrier regions are interposed between the oxide material and the gate structure.

In another embodiment, an apparatus for a semiconductor device is provided. The semiconductor device comprises a region of semiconductor material, a barrier region adjacent to the region of the semiconductor material, a region of insulating material, and a gate structure overlying the region of semiconductor material. The barrier region is interposed between the region of semiconductor material and at least a portion of the insulating material, resulting in an outgassing path within the region of insulating material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 1-11 are cross-sectional views and top views that illustrate a semiconductor device structure and exemplary methods for fabricating the semiconductor device structure in exemplary embodiments.

DETAILED DESCRIPTION

Figure 3:
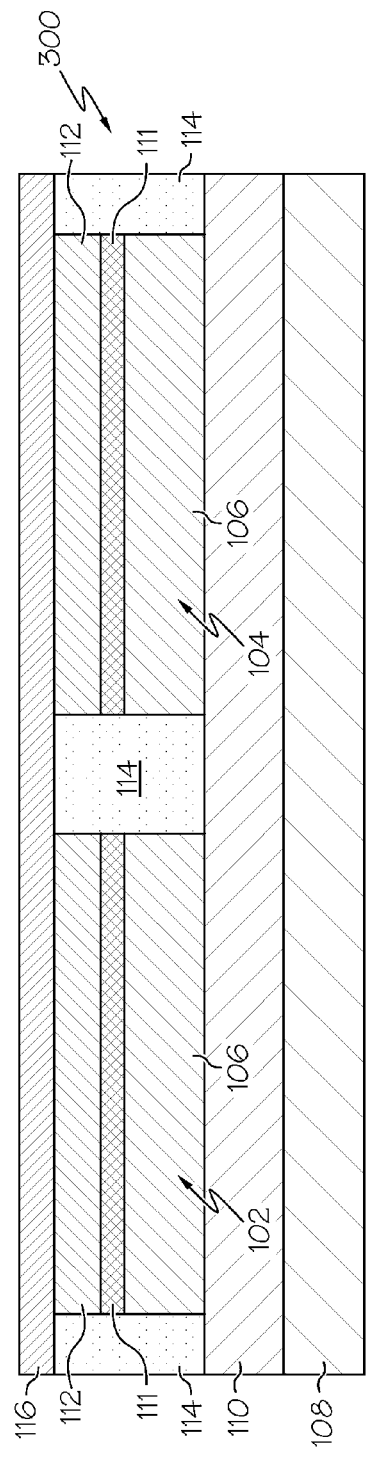

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of semiconductor devices are well known and so, in the interest of brevity, many conventional steps will only be mentioned briefly herein or will be omitted entirely without providing the well known process details.

Referring now to FIG. 1 and FIG. 2, in an exemplary embodiment, the illustrated fabrication process begins by providing an appropriate semiconductor substrate and forming electrically isolated regions 102, 104 of semiconductor material 106 resulting in semiconductor device structure 100. FIG. 2 depicts a top view of the semiconductor device structure 100 and FIG. 1 depicts a cross-sectional view of the semiconductor device structure 100 of FIG. 2 along the line 1-1. In the illustrated embodiment, the semiconductor substrate is realized as silicon-on-insulator (SOI) substrate having a support layer 108, a layer of insulating material 110 on the support layer 108, and a layer of semiconductor material 106 on the layer of insulating material 110. FIGS. 1-2 depict the semiconductor device structure 100 after electrically isolating regions 102, 104 of the layer of semiconductor material 106, as described in greater detail below. The isolated regions 102, 104 may be utilized to form electrically isolated transistor devices, and accordingly, for convenience, but without limitation, the isolated regions 102, 104 may alternatively be referred to herein as transistor regions.

In accordance with one embodiment, the insulating material 110 is realized as an oxide layer formed in a subsurface region of the semiconductor substrate, also known as a buried oxide (BOX) layer. For example, the layer of insulating material 110 may be formed by an ion implantation process followed by high temperature annealing to create a buried layer of silicon dioxide. In other embodiments, an oxidized wafer may be bonded to the support layer 108 from a donor wafer to obtain the layer of insulating material 110 between the support layer 108 and a layer of semiconductor material 102 overlying the layer of insulating material 110. It should be understood that the fabrication process described herein is not constrained by the dimensions of the semiconductor material 106 or the insulating material 110. Further, it should be appreciated that the fabrication process described below may also be used to create devices from a bulk semiconductor substrate. In an exemplary embodiment, the semiconductor material 106 overlying the insulating layer 110 comprises a silicon material, wherein the term "silicon material" is used herein to encompass the relatively pure silicon materials typically used in the semiconductor industry as well as silicon admixed with other elements such as germanium, carbon, and the like. Alternatively, the semiconductor material 106 can be realized as germanium, gallium arsenide, and the like, or the semiconductor material 106 can include layers of different semiconductor materials.

In an exemplary embodiment, the electrically isolated regions 102, 104 are formed by performing shallow trench isolation (STI) on the semiconductor substrate. In this regard, the fabrication process continues by forming a masking material 112 overlying the semiconductor material 106, patterning the masking material 112 to leave exposed portions of the underlying semiconductor material 106, etching trenches into the exposed portions of the semiconductor material 106 using the masking material 112 as an etch mask, and forming insulating material 114 in the trenches to electrically isolate regions 102, 104. It should be appreciated that although the subject matter is described herein in the context of shallow trench isolation, in practical embodiments, the electrically isolated regions 102, 104 may be formed using another isolation process (e.g., local oxidation of silicon) known in the art.

In an exemplary embodiment, a layer of oxide material 111 (alternatively referred to herein as the pad oxide) is formed overlying the semiconductor material 106, and the layer of masking material 112 is formed overlying the oxide material 111. The layer of masking material 112 is formed by conformally depositing a hard mask material, such as a nitride material (e.g., silicon nitride, silicon oxynitride, or the like) overlying the layer of insulating material 106, to a thickness within the range of about 30 nm to 200 nm. A nitride material, such as silicon nitride, is preferable because it accommodates the selective etching of underlying semiconductor material 106 when subsequently used as an etch mask. Accordingly, the portions of the masking material 112 overlying the regions 102, 104 may hereinafter be referred to for convenience, but without limitation, as the pad nitride. The pad nitride 112 is patterned to mask the desired transistor regions 102, 104 of semiconductor material 106, and an anisotropic etchant is utilized to remove exposed (or unprotected) portions of the pad oxide 111 and the semiconductor material 106 to form trenches between regions 102, 104. In an exemplary embodiment, the trenches are formed about the perimeters of regions 102, 104, and the trenches are etched to a depth at least equal to the thickness of the layer of semiconductor material 106. In this regard, in the illustrated embodiment depicting a SOI substrate, the trenches are etched to a depth that exposes the underlying insulating material 110.

After forming trenches, a layer of insulating material 114 is formed in the trenches by conformally depositing a layer of an oxide material, such as silicon dioxide, to a thickness greater than or equal to the layer of semiconductor material 106 using plasma enhanced chemical vapor deposition (PECVD) process or another suitable deposition process. In practice, the oxide material 114 may be deposited to a thickness greater than the depth of the trenches (i.e., a thickness greater than the sum of the thicknesses of layers 106, 111 and 112). After forming the oxide material 114 in the trenches, chemical-mechanical planarization (CMP) is used to obtain a substantially planar surface, resulting in the semiconductor device structure 100 shown in FIGS. 1-2. In an exemplary embodiment, the oxide material 114 is uniformly removed until reaching the pad nitride 112. In other words, the fabrication process ceases planarizing the oxide material 114 when the upper surface of the underlying pad nitride 112 is exposed. The remaining oxide material 114 may hereinafter be referred to for convenience, but without limitation, as the field oxide.

Figure 4:
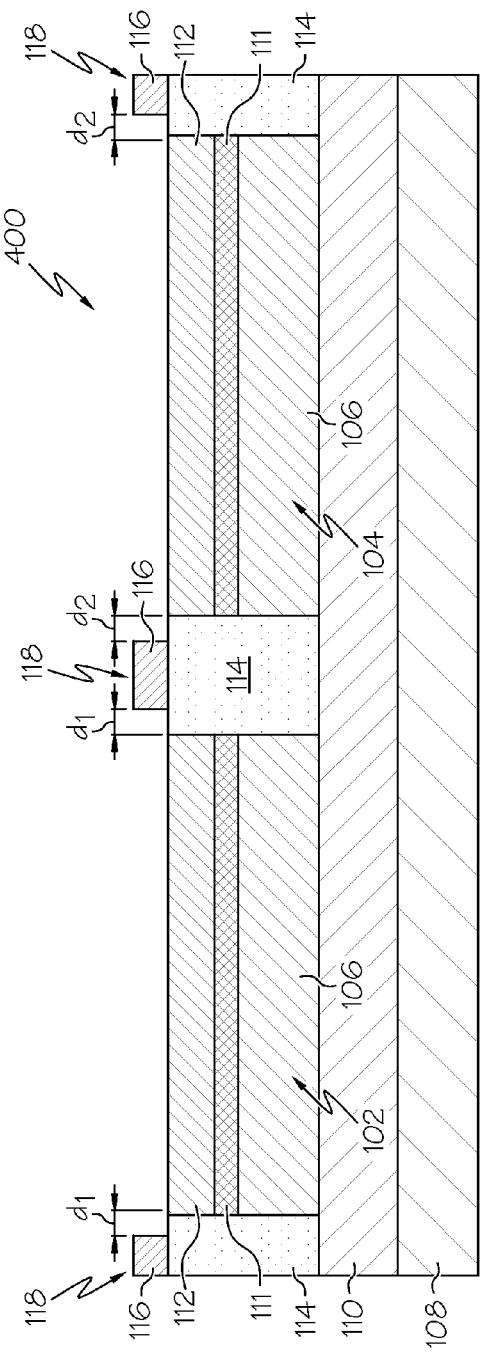

Referring now to FIG. 3-5, in an exemplary embodiment, the fabrication process continues by forming a layer of masking material 116 overlying the semiconductor device structure 100, resulting in the semiconductor device structure 300 of FIG. 3. FIG. 3 depicts a cross-sectional view of the semiconductor device structure 300. Portions of the masking material 116 are selectively removed to create and define a mask 118 overlying the field oxide 114, resulting in the semiconductor device structure 400 of FIGS. 4-5. FIG. 5 depicts a top view of the semiconductor device structure 400 and FIG. 4 depicts a cross-sectional view of the semiconductor device structure 400 of FIG. 5 along the line 4-4. As described in greater detail below, the mask 118 is used to form barrier regions adjacent to the transistor regions 102, 104 to prevent diffusion of oxygen molecules from the field oxide 114 to materials used for the gate electrode of subsequently formed transistor devices.

As best shown in FIG. 4, the vertical sidewalls of the mask 118 are offset from the boundary (or interface) between the field oxide 114 and the transistor regions 102, 104 in a direction parallel to the width of the regions 102, 104 such that the mask 118 overlies central (or interior) portions of the field oxide 114 and leaves exposed portions of the field oxide 114 that are adjacent to and/or abutting the transistor regions 102, 104. The mask 118 is offset from the boundary between the field oxide 114 and transistor region 102 by a first distance ($d_1$) from opposing edges of the transistor region 102, and the mask 118 is offset from the boundary between the field oxide 114 and transistor region 104 by a second distance ($d_2$) from opposing edges of the transistor region 104. The offset distances are chosen such that the sum of the width of a transistor region 102, 104 and the width of the barrier regions subsequently formed about that transistor region 102, 104 is greater than the width of the gate structure subsequently formed overlying that respective transistor region 102, 104, as described in greater detail below. Additionally, the length that the mask 118 is offset from the transistor regions 102, 104 is chosen such that the length of the subsequently formed barrier regions is greater than or equal to the length of the subsequently formed gate structures. As shown in FIG. 5, the length that the mask 118 is offset from the transistor regions 102, 104 may be greater than or equal to the length of the transistor regions 102, 104. Additionally, as shown in FIG. 5, in some embodiments, the vertical sidewalls of the mask 118 may also be offset from the boundary between the field oxide 114 and the transistor regions 102, 104 around the entire perimeter of the regions 102, 104 in a similar manner. In this manner, the mask 118 exposes portions of the field oxide 114 adjacent to the transistor regions 102, 104 about the perimeters of the transistor regions 102, 104.

In accordance with one or more embodiments, the mask 118 is realized as a hard mask formed by conformally depositing a layer of a hard mask material 116, such as silicon nitride, overlying the pad nitride 112 and the field oxide 114. In an exemplary embodiment, the thickness of the hard mask material 116 is less than the thickness of the pad nitride 112, preferably within the range of about 10 nm to 20 nm thinner than the pad nitride 112. In this embodiment, a layer of photoresist is applied and patterned to mask the portions of the masking material 116 overlying central portions of the field oxide 114, and the exposed portions of the masking material 116 are removed by etching the masking material 116 with a suitable etchant chemistry, such as hydrogen bromide or a fluorine-based chemistry, using the photoresist as an etch mask, resulting in the semiconductor device structure 400 of FIGS. 4-5. In accordance with one or more alternative embodiments, instead of a hard mask material, the masking material 116 may be realized as a photoresist material, wherein the mask 118 is realized by applying the photoresist material and patterning and removing portions of the photoresist material using photolithography, resulting in the mask 118. The thickness of the photoresist material 116 for the mask 118 is preferably within the range of about 100 nm to about 500 nm, depending on the strength of subsequent ion implantation steps and characteristics of the type of photoresist material 116 being used.

Figure 7:
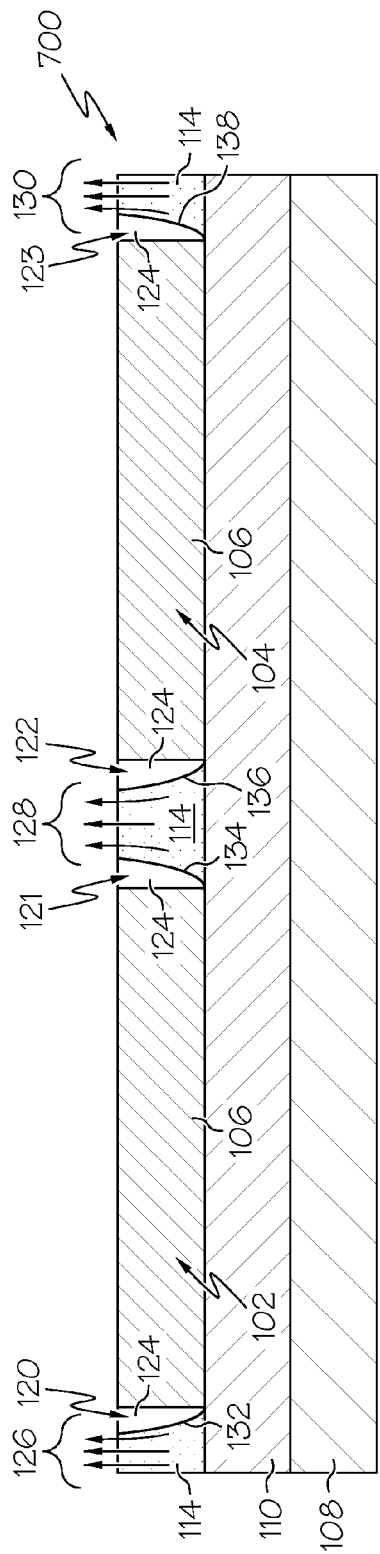
Figure 8:
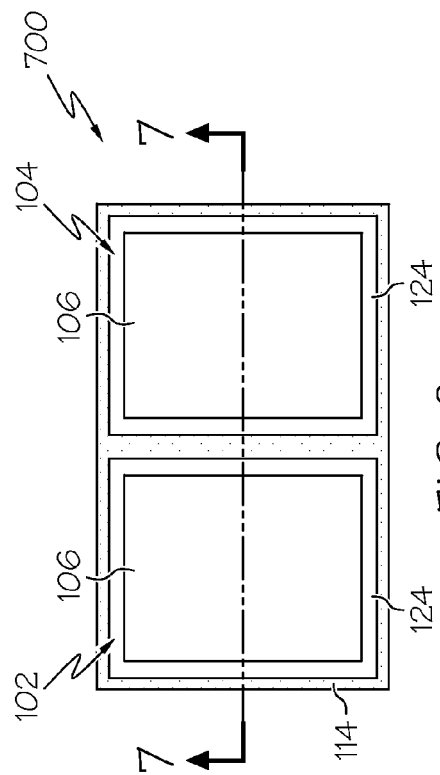

Referring now to FIGS. 6-8, in an exemplary embodiment, the fabrication process continues by forming barrier regions 120, 121, 122, 123 within the exposed (or unprotected) portions of the field oxide 114 adjacent to the transistor regions 102, 104, resulting in the semiconductor device structure 700. FIG. 6 depicts a cross-sectional view of the semiconductor device structure 400 illustrating the formation of barrier regions 120, 121, 122, 123. FIG. 8 depicts a top view of the semiconductor device structure 700 and FIG. 7 depicts a cross-sectional view of the semiconductor device structure 700 of FIG. 8 along the line 7-7. By virtue of the sidewalls of the mask 118 being offset from the boundaries of the transistor regions 102, 104 as set forth above, the barrier regions 120, 121, 122, 123 are adjacent to and abut the transistor regions 102, 104. The barrier regions 120, 121, 122, 123 comprise an oxygen-diffusion barrier material 124 that inhibits or otherwise discourages diffusion of oxygen from the field oxide 114 through the barrier regions 120, 121, 122, 123, as described in greater detail below. In an exemplary embodiment, the barrier regions 120, 121, 122, 123 are interposed between the field oxide 114 and the transistor regions 102, 104 such that the barrier regions 120, 121, 122, 123 prevent the field oxide 114 from contacting the transistor regions 102, 104. In this regard, in the illustrated embodiment depicting a SOI substrate, the barrier regions 120, 121, 122, 123 extend to and/or abut the insulating material 110 underlying the semiconductor material 106. In this manner, the upper surface of the field oxide 114 is spaced apart from the transistor regions 102, 104 and from gate structures subsequently formed thereon. As described in greater detail below, the barrier regions 120, 121 inhibit diffusion of oxygen from the field oxide 114 to a gate structure having a width greater than transistor region 102 that is subsequently formed overlying transistor region 102 and/or overlapping onto barrier regions 120, 121, and similarly, the barrier regions 122, 123 inhibit diffusion of oxygen from the field oxide 114 to a gate structure having a width greater than transistor region 104 that is subsequently formed overlying transistor region 104 and/or overlapping onto barrier regions 122, 123.

In an exemplary embodiment, the oxygen-diffusion barrier material 124 comprises silicon oxynitride formed within exposed portions of the field oxide 114 that are not protected by the mask 118, as described in greater detail below. It should be noted that other materials having the same general properties and characteristics could be used as the oxygen-diffusion barrier material 124 in lieu of silicon oxynitride. That said, silicon oxynitride is commonly used for other purposes in semiconductor manufacturing processes, is accepted for use in the industry, and is well documented. Accordingly, preferred embodiments employ silicon oxynitride for the oxygen-diffusion barrier material 124 of barrier regions 120, 121, 122, 123. In an exemplary embodiment, the nitrogen concentration of the barrier regions 120, 121, 122, 123 is preferably between about twenty-five percent to about fifty percent nitrogen, however, practical embodiments may employ barrier regions having a greater or lesser concentration of nitrogen.

Referring now to FIG. 6, in accordance with one embodiment, the barrier regions 120, 121, 122, 123 are formed by implanting nitrogen ions or a nitrogen ionized species, illustrated by arrows 125, into the exposed portions of the field oxide 114 using the pad nitride 112 and mask 118 as an ion implantation mask. The maximum dopant concentration of the nitrogen ions (or the nitrogen ionized species) within the barrier regions 120, 121, 122, 123 is preferably in the range of about $1\times10^{12}/cm^3$ to about $1\times10^{19}/cm^3$. As shown in FIGS. 6-7, in an exemplary embodiment, the depth of the implantation for the barrier regions 120, 121, 122, 123 is chosen such that the barrier regions 120, 121, 122, 123 extend to and/or abut the insulating material 110. In this manner, the barrier regions 120, 121, 122, 123 abut the entire vertical boundary of the transistor regions 102, 104.

After forming the barrier regions 120, 121, 122, 123, the fabrication process continues by removing the mask 118. When the mask 118 comprises a nitride material, the masking material 116 is removed by plasma-based reactive ion etching (RIE) or chemical etching with commonly known etchant chemistries, such as hydrogen bromide or a fluorine-based chemistry. Since the entire wafer is exposed to the etchant chemical, this may also result in simultaneous removal of exposed upper portions of the pad nitride 112, the upper portions of field oxide 114, and the upper portions of barrier regions 120, 121, 122, 123. In other embodiments, if the masking material 116 comprises photoresist, the mask 118 is removed by a photoresist removal process using commonly known etchant chemistries that removes the photoresist material 116 and leaves the field oxide 114 and pad nitride 112 substantially intact. The mask 118 prevents ions from penetrating the underlying portions of the field oxide 114, resulting in outgassing paths (indicated by arrows 126, 128, 130) for diffusion of oxygen from the exposed surface of the field oxide 114 after the mask 118 is removed, as described in greater detail below.

After removing the mask 118, the fabrication process continues by performing a high-temperature annealing process to activate the remaining portions of barrier regions 120, 121, 122, 123. In this regard, when the field oxide 114 is realized as silicon dioxide, the thermal annealing facilitates formation of silicon oxynitride within barrier regions 120, 121, 122, 123. The semiconductor device structure may be heated to a temperature between about 600° C. to about 1200° C. using either a rapid thermal anneal or a furnace anneal to activate the barrier regions 120, 121, 122, 123. Any pad nitride 112 and/or pad oxide 111 remaining after the high-temperature annealing may be removed by performing a hot phosphoric acid ($H_3PO_4$) etching process or another known etching process to obtain the semiconductor device structure 700 of FIGS. 7-8. As shown in FIG. 8, when the mask 118 is also offset from the boundary between the field oxide 114 and the transistor regions 102, 104 about the perimeter of the transistor regions 102, 104, contiguous boundary regions are formed about the perimeter of each respective transistor region 102, 104 (e.g., boundary regions 120 and 121 are contiguous and boundary regions 122 and 123 are contiguous).

It will be appreciated that heating the semiconductor device structure 700 also encourages or otherwise promotes diffusion and/or outgassing of oxygen molecules from within the field oxide 114. As described above, the barrier regions 120, 121, 122, 123 are resistant to the diffusion of oxygen, and thus, the contours (or edges) of the barrier regions 120, 121, 122, 123 that comprise the boundaries with the field oxide 114 define outgassing paths for the oxygen molecules to diffuse from the exposed surface of the field oxide 114. In this regard, the contour 132 of barrier region 120 along the boundary with the field oxide 114 defines an outgassing path that directs oxygen molecules away from transistor region 102 causing the oxygen to diffuse from the exposed surface of the field oxide 114 and away from the transistor region 102 in the direction indicated by arrows 126. Similarly, the contours 134, 136 of barrier regions 121, 123 along the boundary with the field oxide 114 define an outgassing path that directs oxygen molecules to diffuse from the exposed surface of the field oxide 114 and away from transistor regions 102, 104 in the direction indicated by arrows 128, and contour 138 of barrier region 123 along the boundary with the field oxide 114 defines an outgassing path that directs oxygen molecules to diffuse from the exposed surface of the field oxide 114 and away from transistor region 104 in the direction indicated by arrows 130. Thus, when the semiconductor device structure 700 is heated, oxygen molecules in the field oxide 114 diffuse from the field oxide 114 through the outgassing paths in the direction indicated by arrows 126, 128, 130 because the outgassing paths are less resistant to diffusion than the barrier regions 120, 121, 122, 123.

Referring again to FIGS. 6-8, in accordance with an alternative embodiment, the barrier regions 120, 121, 122, 123 are formed by nitriding the surface of the semiconductor device structure 400. In this embodiment, the fabrication process continues by directing a plasma containing nitrogen (i.e., plasma nitridation) onto the surface of the semiconductor device structure 400, illustrated by arrows 125. Depending on the embodiment, the barrier regions 120, 121, 122, 123 may be formed by directing a nitrogen-rich plasma onto the surface of the semiconductor device structure 400 using a slot plane antenna (e.g., SPA-N nitridation), by directing an ammonia plasma onto the surface of the semiconductor device structure 400 during a rapid thermal heating (e.g., $RT-NH_3$ nitridation), or by performing another nitridation process. The nitrogen from the plasma penetrates exposed portions of the field oxide 114, as will be appreciated in the art. The pad nitride 112 functions as a protective mask that prevents nitridation of the semiconductor material 106, and the mask 118 prevents nitridation of the underlying portions of the field oxide 114. When plasma nitridation is used to form barrier regions 120, 121, 122, 123, the mask 118 is preferably realized as a hard mask material (e.g., silicon nitride), however, in some embodiments, a photoresist material may be used provided the particular type of photoresist material being used can withstand exposure to the plasma being used. After performing plasma nitridation to form barrier regions 120, 121, 122, 123, the mask 118 is removed and a high-temperature annealing process is performed to form barrier regions 120, 121, 122, 123 comprising silicon oxynitride as described above. Similarly, any pad nitride 112 and/or pad oxide 111 remaining after the high-temperature annealing may be removed by performing a hot phosphoric acid ($H_3PO_4$) etching process or another known etching process to obtain the semiconductor device structure 700 of FIGS. 7-8.

Referring now to FIGS. 9-11, in an exemplary embodiment, the fabrication process continues by forming gate structures 140, 142 overlying the isolated transistor regions 102, 104. FIG. 10 depicts a top view of the semiconductor device structure 900, FIG. 9 depicts a cross-sectional view of the semiconductor device structure 900 of FIG. 10 along the line 9-9, and FIG. 11 depicts a cross-sectional view of the semiconductor device structure 900 of FIG. 10 along the line 11-11. The gate structure 140 overlying a first isolated region 102 of semiconductor material 106 comprises the gate electrode for a transistor device subsequently formed on the first isolated region 102 and the gate structure 142 overlying a second isolated region 104 of semiconductor material 106 comprises the gate electrode for a transistor device subsequently formed on second isolated region 104. The gate structures 140, 142 can be created using a conventional gate stack module or any combination of well-known process steps. In the illustrated embodiment, the gate structures 140, 142 comprise at least one layer of dielectric material 144 and at least one layer of conductive material 146. It should be understood that various numbers, combinations and/or arrangements of materials may be utilized for the gate structure in a practical embodiment, and the subject matter described herein is not limited to any particular number, combination, or arrangement of gate material(s) in the gate structure.

The gate structures 140, 142 are formed by forming the layer of dielectric material 144, forming the layer of conductive material 146 overlying the layer of dielectric material 144, and removing portions of the dielectric material 144 and conductive material 146 to define the gate structures 140, 142 overlying the isolated regions 102, 104 of semiconductor material 106. In an exemplary embodiment, the dielectric material 144 comprises a high-k dielectric material conformally deposited overlying the semiconductor device structure 700 in a conventional manner. The high-k dielectric material is realized as a material having a dielectric constant greater than that of silicon dioxide, such as, for example, a hafnium-based oxide. Depending on the embodiment, the thickness of the high-k dielectric layer 144 may range from about 0.5 nm to about 3 nm. After forming the high-k dielectric layer 144, the fabrication process continues by conformally depositing the layer of the conductive material 146 overlying the high-k dielectric layer 144 in a conventional manner. Depending on the embodiment, the conductive material 146 may be realized as polysilicon or a metal (e.g., titanium nitride, aluminum, or the like), and the thickness of the conductive material 146 may range from about 20 nm to about 100 nm. After forming the dielectric material 144 and the conductive material 146, in an exemplary embodiment, the fabrication process continues by selectively removing the dielectric material 144 and the conductive material 146 using an anisotropic etchant to define the gate structures 140, 142 in a conventional manner.

As best shown in FIGS. 9-10, in an exemplary embodiment, the width of each gate structure 140, 142 is greater than or equal to the width of its underlying transistor region 102, 104. As described above, the mask 118 is offset from the boundaries of the transistor regions 102, 104 by a distance chosen such that the width of each gate structure 140, 142 is less than the sum of the width of is underlying transistor region 102, 104 plus the widths of the barrier regions 120, 121, 122, 123 adjacent to that respective transistor region 102, 104. In other words, the offset distance ($d_1$) for the mask 118 relative to transistor region 102 is chosen such that the width of the gate structure 140 is less than or equal to the sum of the width of transistor region 102 plus the widths at the upper surface of barrier regions 120, 121. Similarly, the offset distance ($d_2$) for the mask 118 relative to transistor region 104 is chosen such that the width of the gate structure 142 is less than or equal to the sum of the width of transistor region 102 plus the widths at the upper surface of the barrier regions 122, 123. In an exemplary embodiment, the offset distances ($d_1$, $d_2$) are chosen such that the width of each barrier region 120, 121, 122, 123 at its upper surface is at least equal to four standard deviations (e.g., $4\sigma$) for the width of the gate structures 140, 142. In this regard, in accordance with one embodiment, $d_1=d_2=4\sigma$, where $\sigma$ is the standard deviation for the width of the gate structures. This accounts for manufacturing variations and ensures that the gate structures 140, 142 will overlie the barrier regions 120, 121, 122, 123 and will not overlap onto the field oxide 114 with a high degree of probability (e.g., greater than 99% assuming Gaussian distribution for the width of the gate structures 140, 142). It should be appreciated that the subject matter is not intended to be limited to any particular offset distance, and that in practice, the offset distances ($d_1$, $d_2$) will vary to suit the needs of a particular application and/or device.

After forming the gate structures 140, 142, any number of known process steps, modules, and techniques can be performed to complete the fabrication of transistor devices on regions 102, 104. For example, the fabrication process may continue by forming spaced-apart source and drain regions 150, 152 about the gate structure 140 by implanting ions of a conductivity-determining impurity type into transistor region 102 using the gate structure 140 as an implantation mask to form a transistor structure on region 102 in a conventional manner. The barrier regions 120, 121, 122, 123 are interposed between the field oxide 114 and the gate structures 140, 142 and inhibit oxygen molecules from the field oxide 114 from diffusing into the gate structures 140, 142 during subsequent thermal annealing to activate the source and drain regions 150, 152. In this regard, the outgassing paths formed by the barrier regions 120, 121, 122, 123 direct oxygen molecules away from the gate structures 140, 142 and towards the exposed surfaces of the field oxide 114 as indicated by arrows 126, 128, 130, causing the oxygen to diffuse from the exposed surface of the field oxide 114 rather than diffusing to the gate structures 140, 142. As a result, the sensitivity of the threshold voltage for a transistor device to the width of its respective gate structure is reduced. Fabrication of transistor devices may be completed using well known final process steps, and other back end process steps, which will not be described in detail herein.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a region of semiconductor material;
a barrier region adjacent to the region of the semiconductor material;
a region of insulating material, wherein the barrier region is interposed between the region of semiconductor material and at least a portion of the insulating material, resulting in an outgassing path within the region of insulating material, and wherein the barrier region is formed only in the region of insulating material; and
a gate structure overlying the region of semiconductor material.

2. The semiconductor device of claim 1, wherein the barrier region comprises nitrided insulating material.

3. The semiconductor device of claim 1, wherein the gate structure is spaced apart from the region of insulating material.

4. The semiconductor device of claim 1, wherein the barrier region is contiguous about a perimeter of the region of semiconductor material.

5. The semiconductor device of claim 1, wherein the insulating material comprises silicon dioxide and the barrier region comprises silicon oxynitride.

6. The semiconductor device of claim 1, wherein a sum of a width of the barrier region and a width of the region of semiconductor material is greater than or equal to a width of the gate structure.

7. The semiconductor device of claim 6, wherein the gate structure has a width greater than the width of the region of semiconductor material.

8. The semiconductor device of claim 7, wherein the gate structure is spaced apart from the region of insulating material.

9. The semiconductor device of claim 1, further comprising a support layer and a layer of insulating material on the support layer, wherein the region of semiconductor material is disposed on the layer of insulating material.

10. The semiconductor device of claim 9, wherein the barrier region extends to, and optionally abuts, the layer of insulating material.

11. The semiconductor device of claim 1, wherein the barrier region is contiguous about a perimeter of the region of semiconductor material.

* * * * *